(12) United States Patent
Song et al.

(10) Patent No.: US 9,793,149 B2
(45) Date of Patent: Oct. 17, 2017

(54) ELECTROSTATIC CLAMPING METHOD AND APPARATUS

(71) Applicant: Oxford Instruments Nanotechnology Tools Limited, Tubney Woods (GB)

(72) Inventors: Yiping Song, Yatton (GB); Joao L G Ferreira, Yatton (GB); Michael Cooke, Yatton (GB)

(73) Assignee: Oxford Instruments Nanotechnology Tools Limited, Tubney Woods (GB)

( * ) Notice: Subject to any disclaimer, the term of this patent is extended or adjusted under 35 U.S.C. 154(b) by 445 days.

(21) Appl. No.: 14/543,945

(22) Filed: Nov. 18, 2014

(65) Prior Publication Data
US 2015/0162234 A1 Jun. 11, 2015

(30) Foreign Application Priority Data

Dec. 5, 2013 (GB) .................................... 1321463.0

(51) Int. Cl.
*H01L 21/683* (2006.01)
(52) U.S. Cl.
CPC ................................ *H01L 21/6833* (2013.01)
(58) Field of Classification Search
USPC ......................................................... 361/234
See application file for complete search history.

(56) References Cited

U.S. PATENT DOCUMENTS

| | | | |
|---|---|---|---|
| 5,452,177 A | 9/1995 | Frutiger | |
| 5,793,192 A * | 8/1998 | Kubly | H01L 21/6833 279/128 |

(Continued)

FOREIGN PATENT DOCUMENTS

EP 0 831 526 A2 3/1998

OTHER PUBLICATIONS

European Search Report dated Mar. 25, 2015 issued in corresponding European Patent Application No. 14193534.6.

*Primary Examiner* — Ronald W Leja
(74) *Attorney, Agent, or Firm* — Polsinelli PC

(57) ABSTRACT

A method of electrostatically clamping a dielectric wafer to a processing table during plasma processing is described. The table has interdigitated electrodes embedded therein. The method comprises applying respective voltages of opposite first and second polarities to adjacent electrodes wherein polarization charges are induced in the wafer with opposite polarity to the respective underlying electrodes thereby electrostatically clamping the wafer to the table; and, after a predetermined time ($t_{on}$), reversing the polarities of the voltages so that the polarization charges and electrostatic clamping continues. The on time ($t_{on}$) of each of the first and second polarities is preselected to be a) greater than the time ($T_1$) required to generate sufficient polarization charge in the wafer such that the wafer is held with a required pressure for at least 2 seconds after withdrawing of clamping voltages, b) less than the time ($T_2$) for the wafer to separate from the table by a first predetermined amount while in the presence of a steady voltage and a plasma, and c) less than the time ($T_3$) for the wafer to separate from the substrate by a second predetermined amount in the absence of a plasma, after an applied voltage has been applied.

The time ($t_s$) for switching between the first and second polarities is less than the time ($T_1$) and less than 2 seconds.

22 Claims, 11 Drawing Sheets

(56) References Cited

U.S. PATENT DOCUMENTS

| | | | | |
|---|---|---|---|---|
| 6,163,448 A * | 12/2000 | Hausmann | ............ | H02N 13/00 361/234 |
| 6,947,274 B2 * | 9/2005 | Kellerman | ............ | H02N 13/00 361/234 |
| 6,992,876 B1 * | 1/2006 | Nakajima | ......... | H01L 21/67109 118/724 |
| 2005/0047057 A1 * | 3/2005 | Kwon | ................ | H01L 21/6833 361/234 |
| 2005/0057881 A1 * | 3/2005 | Qin | .................... | H01L 21/6833 361/234 |
| 2006/0023393 A1 * | 2/2006 | Poh | ....................... | B23Q 3/154 361/234 |
| 2007/0297118 A1 | 12/2007 | Fujii | | |
| 2008/0192405 A1 * | 8/2008 | Purohit | ................ | H02N 13/00 361/234 |
| 2009/0109595 A1 * | 4/2009 | Herchen | ............ | H01L 21/6831 361/234 |
| 2011/0026187 A1 * | 2/2011 | Reynolds | ............... | H01J 37/20 361/234 |
| 2011/0097510 A1 * | 4/2011 | Makino | ............ | H01J 37/32706 427/523 |
| 2011/0102965 A1 * | 5/2011 | Fujisawa | ............ | H01L 21/6833 361/234 |
| 2014/0090597 A1 * | 4/2014 | Hirasawa | ......... | H01J 37/32568 118/723 R |
| 2015/0162234 A1 * | 6/2015 | Song | .................. | H01L 21/6833 361/234 |

* cited by examiner

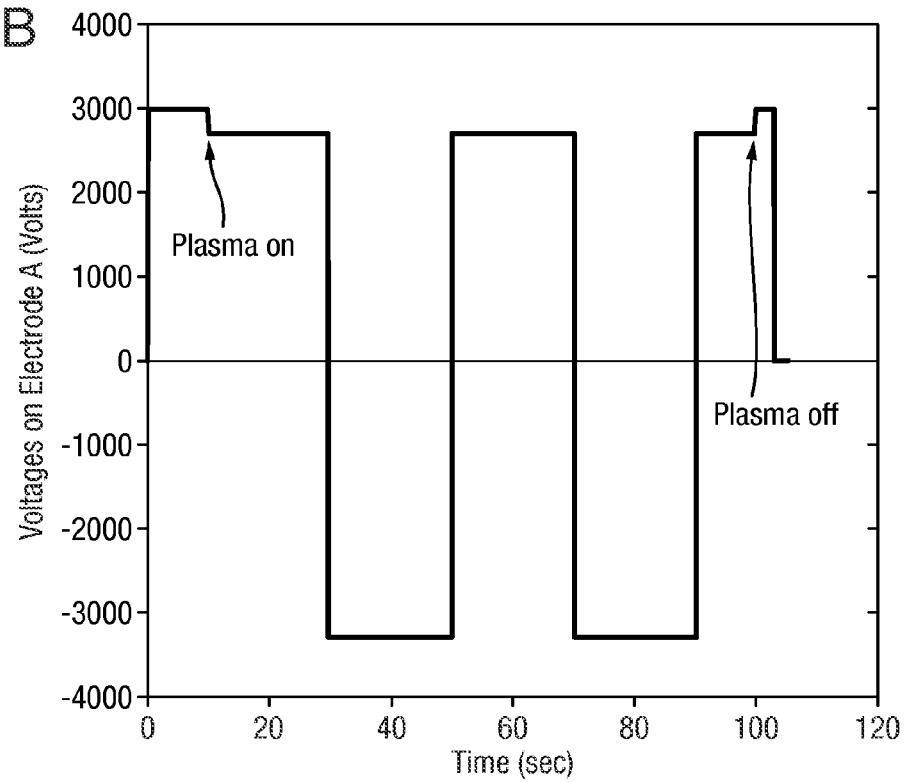
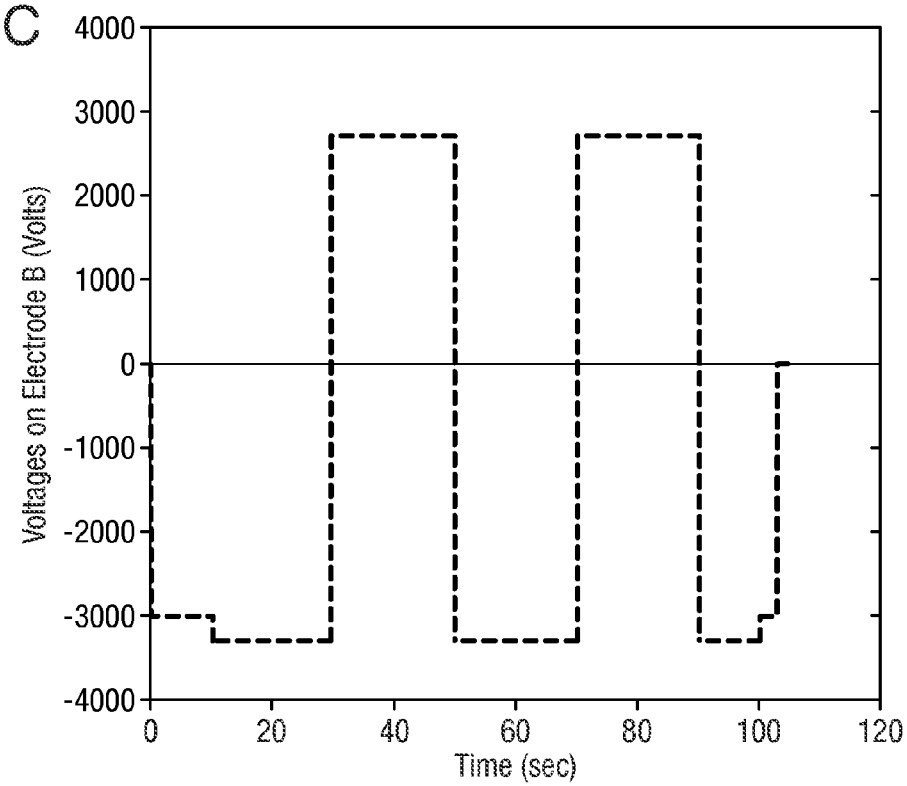

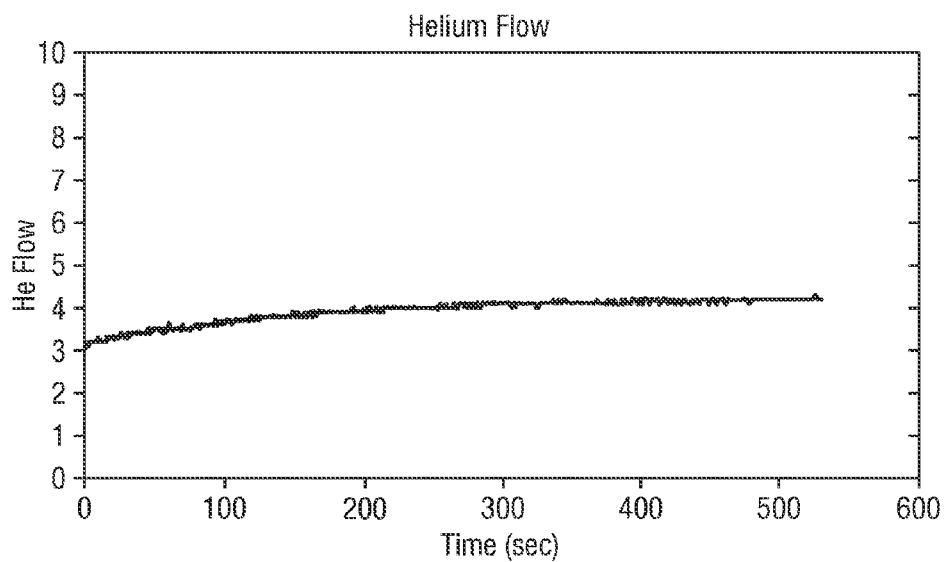
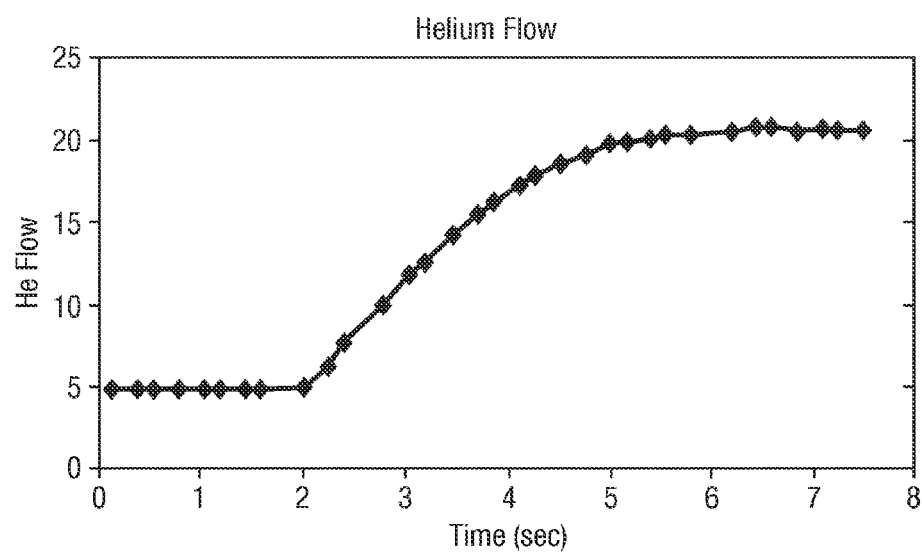

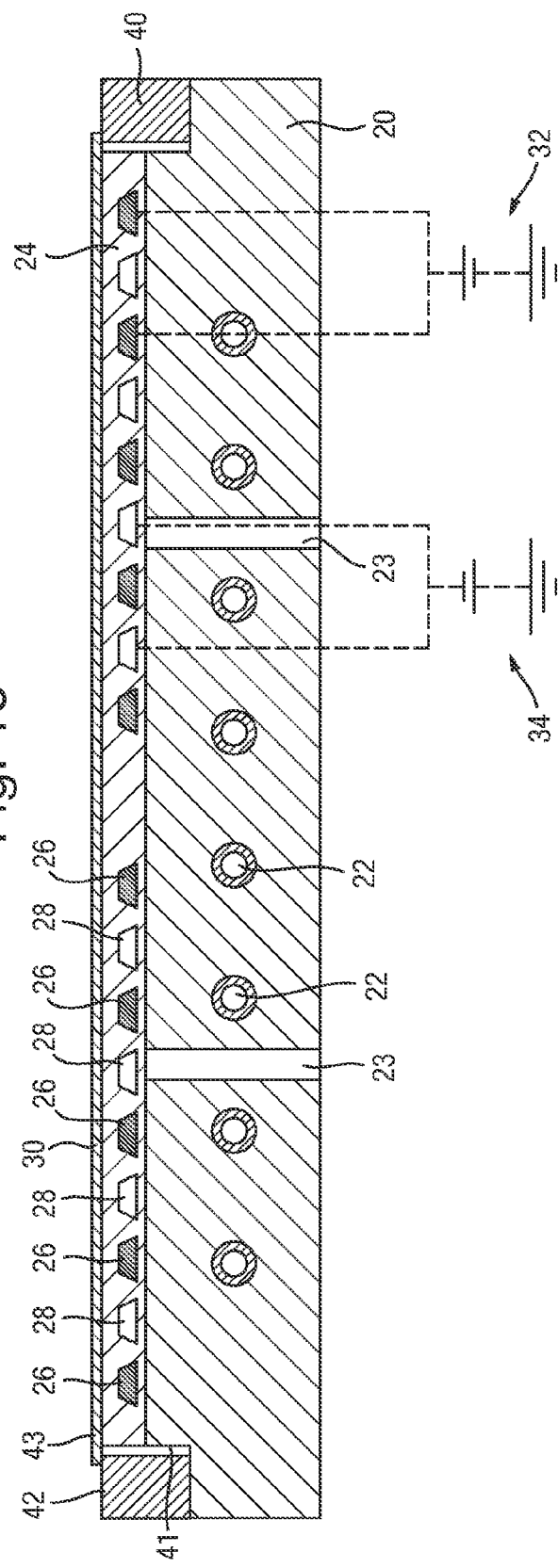

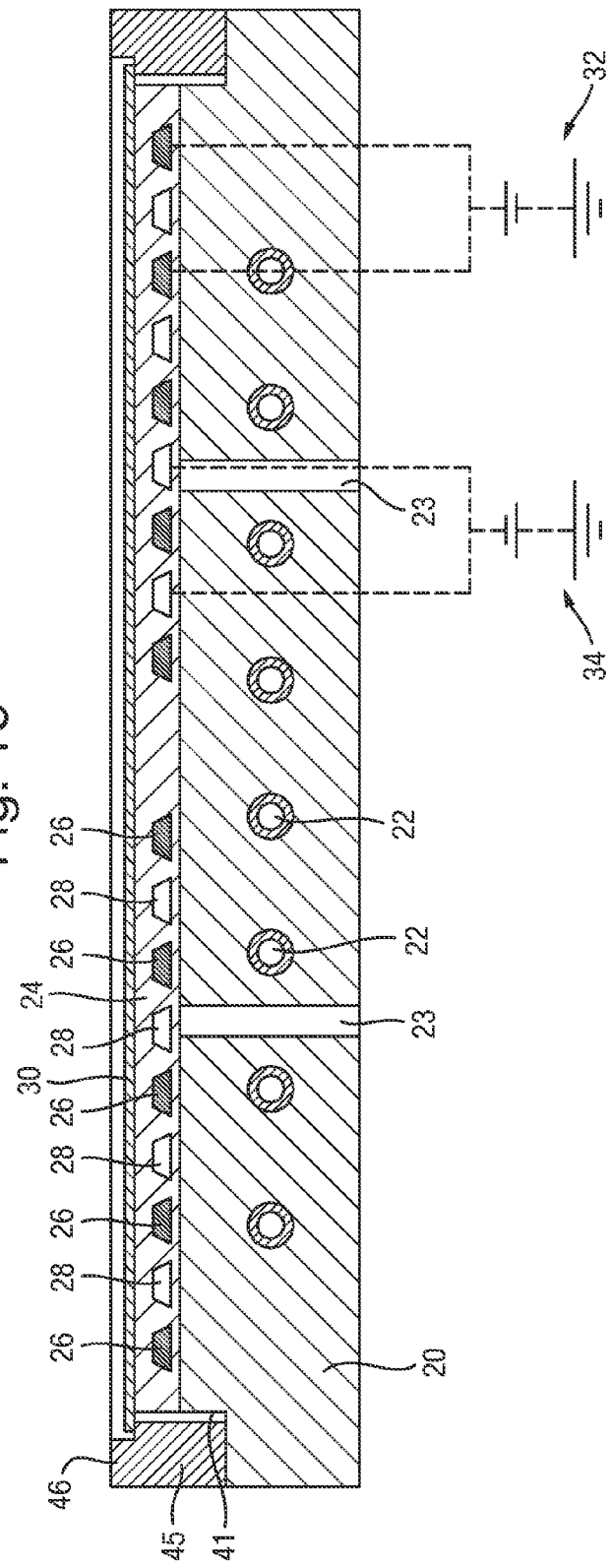

ELECTROSTATIC CLAMPING METHOD AND APPARATUS

CROSS-REFERENCE TO RELATED APPLICATIONS

This application claims priority from Great Britain application 1321463.0 filed on Dec. 5, 2013, the entire contents of which is hereby incorporated by reference.

The invention relates to method and apparatus for electrostatically clamping a dielectric wafer (a work piece) to a process table, typically for use in plasma processing apparatus.

Plasma etching and deposition processes rely on maintaining the wafer temperature within a permitted range. Wafer temperature control is achieved by clamping the wafer to a support table, of which temperature is maintained by using cooling fluid. Deposition processes typically use a wafer temperature in the range 50-500 C; etching processes typically use −100 C to +250 C. It is desirable to keep the wafer within a few degrees of a target temperature, following temperature stabilisation. During processing, energy is applied to the front surface of the wafer by the plasma process in the form of ion bombardment and/or chemical reaction, especially in etch processing. Heat can be flowing either from the table to the wafer or from the wafer to the table during processing, with wafer cooling being more common in etch, and wafer heating the norm in deposition processes. Improving the thermal contact between the wafer and the table decreases the temperature stabilisation time and increases the maximum heat flux to the table, for a given maximum wafer temperature. Both of these effects help to increase the throughput of wafers. Better thermal contact also decreases the variation in wafer temperature caused by other process variances, tending to improve process repeatability.

These processes typically operate at reduced pressure, 0.1-100 Pa for plasma etching and 100-1000 Pa for plasma deposition. Heat transfer between substrate and support table is usually characterised by conduction and radiation, as described in equation 1:

$$H = h(T_{water} - T_{table}) + e_{12} s_{sb}(T_{water}^4 - T_{table}^4) W\ m^{-2} \quad (1)$$

Where

H W m$^{-2}$ is the heat flux between the wafer and table
$T_{wafer}$ K is the wafer temperature
$T_{table}$ K is the table temperature
h W m$^{-2}$ K$^{-1}$ is a linear conduction heat transfer coefficient
$e_{12}$ is the effective emissivity of the pair of surfaces for radiative heat transfer
$s_{sb}$ W m$^{-2}$ K$^{-4}$ is the Stefan-Boltzmann constant It is well known that the heat transfer coefficient depends on the gap between the surfaces, the pressure and nature of the gas between the surfaces, and the accommodation coefficient, which describes the degree to which gas particles coming into contact with each surface come to thermal equilibrium with that surface. Increasing the heat transfer coefficient is achieved by raising the pressure between the wafer and the table, normally accompanied by clamping the wafer to the table. The use of helium gas pressure normally in the range 100-3000 Pa behind a wafer for heat transfer in semiconductor processing is known as 'helium backside cooling'.

Clamping the wafer to the table is essential when the backside pressure is raised above the processing pressure. Mechanical clamping is possible, but limited by the permitted area of contact to the substrate front face, and by the flexibility of the substrate. It is also vulnerable to particle generation, hence not preferred for mass production. Electrostatic clamping of semiconducting wafers has become the more conventional technique especially in plasma etching. The technique has been disclosed in many places, for example U.S. Pat. No. 5,103,367; GA Wardly Rev Sci instruments 44 (10) pp 1506-1509 (1973); U.S. Pat. No. 6,297,274. The electrostatic clamp or 'chuck' is often abbreviated as ESC.

There is a tendency for the ESC clamping force to diminish with time, believed to be caused by charge migration within the ESC or by accumulation on the surface of the insulation layer normally found on top of the electrostatic clamp. This is typically handled by reversing the charging voltage from wafer to wafer, or by reversing the clamping voltage during the process, provided there are means to retain the wafer during voltage reversal. One such method has been proposed by Kellerman (U.S. Pat. No. 6,947,274 B2), using the inertia of the wafer as the criterion for the timing of voltage reversal: the voltage is reapplied before the backside pressure on the wafer has caused it to accelerate away too far to be recaptured. This has disadvantages of requiring relatively fast switching, and an increased risk of the wafer popping off at any switch transition. Another method is to use multiple zones with independent voltage controls, so that some zones retain the wafer while one zone is switched. This has the disadvantage of requiring multiple power supplies and voltage feed-throughs.

PROBLEMS TO SOLVE

Clamping of insulating materials is more difficult than conductors or semiconductors. It relies on inducing polarisation of the dielectric material of the wafer, using closely spaced or 'interdigitated' conducting electrodes embedded in an insulating medium (U.S. Pat. No. 5,838,529). The voltage required to clamp the wafer is typically substantially higher than for non-insulating wafers, otherwise the clamp force is more limited. The electrostatic clamp conductors are usually covered with an insulating layer, which can be vulnerable to electrical breakdown. Together these restrict the maximum pressure that can be used beneath the wafer to promote heat transfer.

There is also a problem when etching a non-insulating layer on an insulating wafer. When the non-insulating layer is present, charges can be displaced within it by the electrostatic clamp electrodes which enhance the clamping force compared to the force obtainable just from polarisation charge separation. As the layer is etched, the additional clamp force is lost, and either heat transfer is reduced, or electrostatic clamping is lost completely.

SUMMARY OF THE INVENTION

In accordance with a first aspect of the present invention, a method of electrostatically clamping a dielectric wafer to a processing table during plasma processing, the table having interdigitated electrodes embedded therein, comprising applying respective switching voltages of opposite first and second polarities to adjacent electrodes wherein polarisation charges are induced in the wafer with opposite polarity to the respective underlying electrodes thereby electrostatically clamping the wafer to the table; and, after a predetermined time ($t_{on}$), reversing the polarities of the voltages an that the polarisation charges and electrostatic clamping continues characterized in that:

the on time ($t_{on}$) of each of the first and second polarities is preselected to be
  a) greater than the time ($T_1$) required to generate sufficient polarisation charge in the wafer such that the wafer is held with a required pressure for at least 2 seconds after withdrawing of clamping voltages,
  b) less than the time ($T_2$) for the wafer to separate from the table by a first predetermined amount while in the presence of a steady voltage and a plasma, and
  c) less than the time ($T_3$) for the wafer to separate from the substrate by a second predetermined amount in the absence of a plasma, after an applied voltage has been applied; and in that
ii) the time ($t_s$) for switching between the first and second polarities is less than the time ($T_1$) and less than 2 seconds.

We also provide plasma processing apparatus for including a plasma generating chamber within which is provided a processing table having embedded interdigitated electrodes and on which a dielectric wafer is located in use; a voltage source coupled with the interdigitated electrodes; and a control system programmed to control the voltage source to apply respective switching voltages of opposite first and second polarities to adjacent electrodes wherein polarisation charges are induced in the wafer with opposite polarity to the respective underlying electrodes thereby electrostatically clamping the wafer to the table; and after a predetermined time ($t_{on}$) reversing the polarities of the voltages to the second polarity so that the polarisation charges and electrostatic clamping continues, characterized in that:
  i) the on time ($t_{on}$) of each of the first and second polarities is preselected to be
    a) greater than the time ($T_1$) required to generate sufficient polarisation charge in the wafer such that the wafer is held with a required pressure for at least 2 seconds after withdrawing of clamping voltages,
    b) less than the time ($T_2$) for the wafer to separate from the table by a first predetermined amount while in the presence of a steady voltage and a plasma, and
    c) less than the time ($T_3$) for the wafer to separate from the substrate by a second predetermined amount in the absence of a plasma, after an applied voltage has been applied; and in that
  ii) the time ($t_s$) for switching between the first and second polarities is less than the time ($T_1$) and less than 2 seconds.

In accordance with a third aspect of the present invention, we provide a method of generating and storing instructions on a record medium for use by a control system of plasma processing apparatus according to the invention, the method comprising applying respective switching voltages of opposite first and second polarities to adjacent electrodes wherein polarisation charges are induced in the wafer with opposite polarity to the respective underlying electrodes thereby electrostatically clamping the wafer to the substrate; and after a predetermined time ($t_{on}$) reversing the polarities of the voltages so that the polarisation charges and electrostatic clamping continues characterized in that:
  i) the on time ($t_{on}$) of each of the first and second polarities is preselected to be
    a) greater than the time ($T_1$) required to generate sufficient polarisation charge in the wafer such that the wafer is held with a required pressure for at least 2 seconds after withdrawing of clamping voltages,
    b) less than the time ($T_2$) for the wafer to separate from the table by a first predetermined amount while in the presence of a steady voltage and a plasma, and
    c) less than the time ($T_3$) for the wafer to separate from the substrate by a second predetermined amount in the absence of a plasma, after an applied voltage has been applied; and in that
  ii) the time ($t_s$) for switching between the first and second polarities is less than the time ($T_1$) and less than 2 seconds.

We have undertaken a detailed investigation of the processes involved in charge migration and have realized that it is possible to achieve a much more efficient voltage switching process which can be predefined and takes advantage of the effect of charge migration within the wafer as well as directly from the plasma into the interface between the wafer and the table.

Relatively little attention has been paid to the management of mobile electrical charges at the interface between the surface of the electrostatic chuck (table) and the back surface of the wafer. Our invention uses these charges to maintain wafer clamping during polarity switching. We have found that steady clamping of an insulating wafer during a plasma process is possible by periodically reversing the clamping voltage of an interdigitated electrostatic clamp. The clamp force can be maintained for an hour or more, longer than any process time employed in practice, by reversing the voltage every 2-300 seconds. It is not necessary to reduce the backside cooling pressure during voltage reversal; we have seen that the helium leakage flow from behind the wafer increases momentarily by up to 5%, but the wafer does not pop off. We believe that the electric field between the chuck surface (table) and the wafer does not switch uniformly across the whole area, with the edge region having a different charge distribution from the centre due to charge penetration from the plasma. As the voltage is reversed, there is always some area which has a clamping force as the surface charges migrate from one position to another. The switching time interval depends on the rate of migration of mobile electrical charge at the interface. The electrostatic chuck only needs one power supply, capable of driving each side of the two interdigitated electrodes either positive or negative with respect to ground. It does not require independent control of multiple zones, although the technique is equally applicable to such designs.

The gas used to provide the background pressure is typically an inert gas such as Helium.

The necessary minimum period between voltage switching events depends on several time constants, each of which are measured before putting the ESC into service with a specific plasma process. These are:

T1: The time required to generate sufficient polarisation charge in a wafer such that the wafer is held with a required (backside) pressure for at least 2 seconds after withdrawing of clamping voltages.

T2: The time for loss of clamping with plasma using a steady voltage (characteristic of the edge charge migration)

T3: The time for loss of clamping in the absence of plasma, after applying the ESC voltage. (Characteristic of charge migration within the ESC dielectric surrounding the ESC electrodes)

In each case loss of clamping by the first and second predetermined amounts is determined by a corresponding increase in the flow of backside gas to maintain the same pressure. This can be gradual, indicating slow loss of clamping, and in this case we define loss of clamping to be a certain percentage increase, e.g. 20-25% increase, in the gas flow. It can also be very sudden, indicating complete loss of clamping (a 'pop off' event).

T1 is determined as follows:
1. A wafer is clamped under a steady voltage in the absence of plasma, and a (backside) gas pressure is established, preferably in the range 5-15 Torr with a low helium leak flow (preferably less than 2 sccm).
2. After a time interval, the clamp voltage is zeroed, and the gas leak flow is observed in the next minute.
3. The time interval is varied with repeated clamping events, until the minimum clamping voltage on time is established at which the gas flow increases by no more than 20% in two seconds after the clamp voltage is removed. This defines the time at which sufficient polarisation charges are present in the wafer to hold it during voltage switching. The period between voltage reversal events during clamping in use with a plasma is equal to or greater than this time period.

T2 is determined as follows, testing for the time for unclamping due to plasma charges migrating into the wafer-table interface:
1. A wafer is clamped under a steady voltage and plasma is struck. The time for loss of clamping is noted.
2. The test is repeated with the polarity reversed. Again the time is noted.
3. The switching time for use is chosen to be less than the lower (T2) of the two times.

T3 is determined in one specific example by applying a steady clamping voltage with a gas (backside) pressure of, for example, 10 Torr, in the absence of plasma, and monitoring gas flow until the wafer separates from the table, i.e. He flow reaches maximum value with absence of a wafer.

In the conditions we have tested so far, T1 can be a few seconds, T2 can be in the range 5 seconds to 10 minutes, and T3 can be greater than one hour.

The period ($t_{on}$) between voltage reversal events during clamping in use with a plasma is less than the time to lose clamping from plasma charge migration (T2), or from charge migration within the ESC dielectric (T3) and greater than the time to establish wafer polarisation charge (T1).

The time for the transition from one polarity to the other (the voltage reversal time $t_s$) can be longer than the wafer impact time or wafer escape time as disclosed in the method of Kellerman et al (U.S. Pat. No. 6,947,274). The switching time period is also substantially longer than disclosed in the alternating voltage methods of Kellerman et al or Horwitz and Boronkay (U.S. Pat. No. 5,103,167), on that in our method most of the time has a constant clamping voltage. The voltage reversal time $t_s$ should be shorter than either T1 or T2 and is preferably much shorter than the shorter of these.

When etching a non-insulating layer on an insulating wafer, we have found that steady voltages can be used until the layer has almost etched to completion, and then it is necessary to use voltage reversal. The helium leak rate from behind the wafer can be used as a sensitive indicator of the transition point, because it climbs by up to 10% as the non-insulating layer clears. Optical techniques, such as optical emission spectroscopy, reflectometry, spectroscopic reflectivity, or interferometry can also be used as indicators. If voltage reversal is not employed, the substrate can pop off even with relatively low backside pressure (<400 Pa).

The voltages may be switched in a regular manner but this is not essential and indeed the two polarities do not need to be applied for equal times although this is preferred in practice.

It is known that the wafer surface may acquire a DC offset voltage due to the rectifying nature of the plasma. Where means exist for this to be measured or estimated, for example using a conducting test wafer, then the ESC voltages can be offset from ground by a similar amount.

We have also seen some advantage in combining mechanical and electrostatic clamping for insulating wafers. The mechanical clamp allows an increased backside gas pressure for increased heat transfer, in the range 1000-2000 Pa, while the electrostatic clamp force tends to flatten the wafer against the table. This makes the gap under the wafer more uniform, and makes the heat transfer more uniform across the area of the wafer.

The importance of surface charges migrating in the wafer-chuck interface is underlined by the optional use of an edge ring around the wafer, preferably protruding above the wafer surface to a distance of 0.5-3 mm. When this ring is used, the time between switching events can be extended, demonstrating that at least some charges are introduced at the wafer edge.

The methods described here can also be applied to equivalent ESC designs capable of holding multiple wafers.

Some examples of a plasma processing apparatus and methods according to the invention will now be described with reference to the accompanying drawings, in which:—

FIGS. 3B and 3C illustrate a first example of a pair of voltage waveforms applied to respective sets of electrodes showing electrostatic clamping voltages modified to compensate for the plasma DC bias during the plasma on period;

FIGS. 9 and 10 illustrate helium flow rates with time during the determination of a desired voltage waveform;

Figure 1:
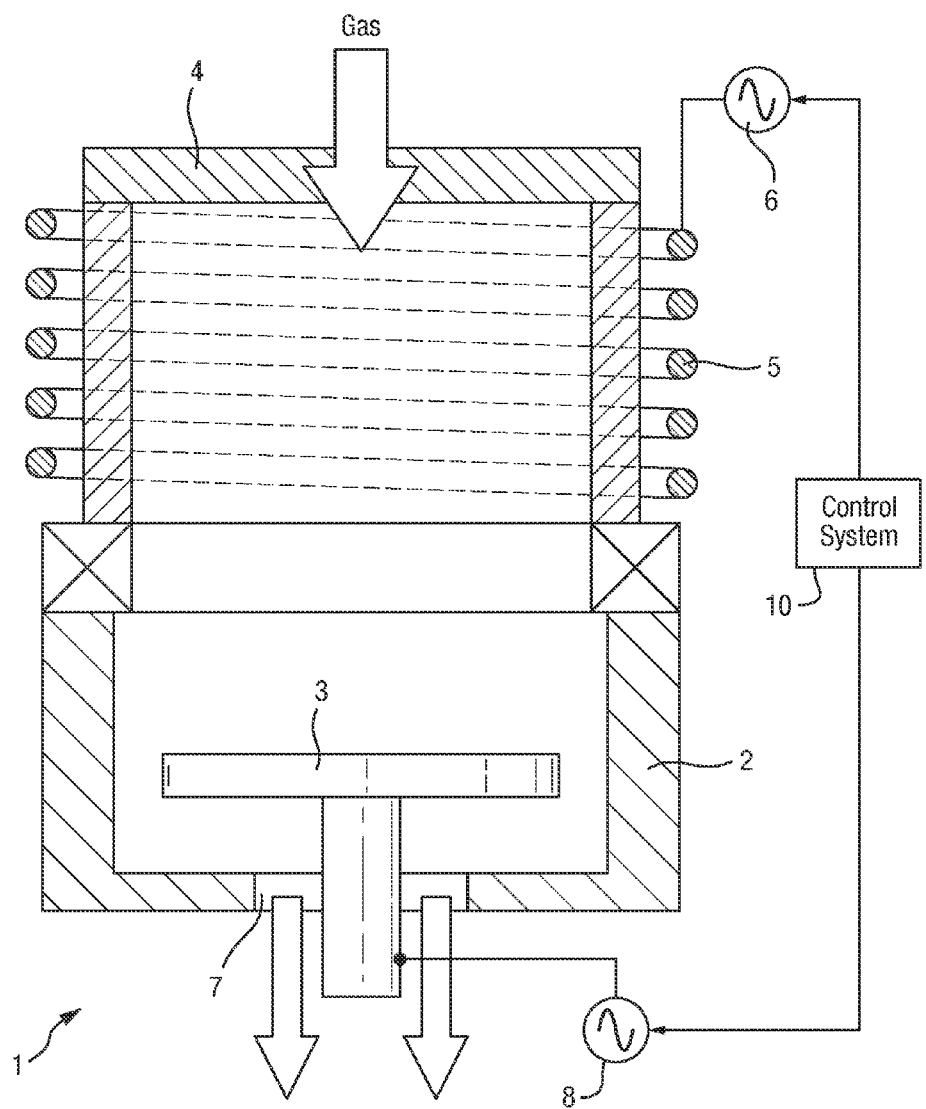
FIG. 1 is a schematic diagram of plasma processing apparatus including an electrostatic clamping table.

FIG. 1 illustrates the primary components of a plasma processing chamber including an airtight housing 2 within which is mounted a process table 3. Gas is supplied through an upper wall 4 of the housing 2 and is converted to plasma via an induction coil 5 coupled to a power source 6 and encircling an upper part of the housing 2.

Plasma gas is extracted under pump action via an opening 7 in a lower wall of the housing 2.

The table 3 is coupled with a source 8 of RF power, typically at 13.56 MHz and is provided with ESC clamping voltages and a gas feed for wafer backside heat transfer (not shown in FIG. 1 but described later).

The power sources 6,8 are connected to a control system 10.

In use, a wafer (not shown) is placed on the table 3.

Process gases flow through the plasma source where they are ionised and dissociated, and pass via contact with a wafer on the table 3 to the exit port 7. The table is normally driven with RE power, often at 13.56 MHz, and provided with ESC clamping voltages and a gas feed for wafer backside heat transfer.

Figure 2:
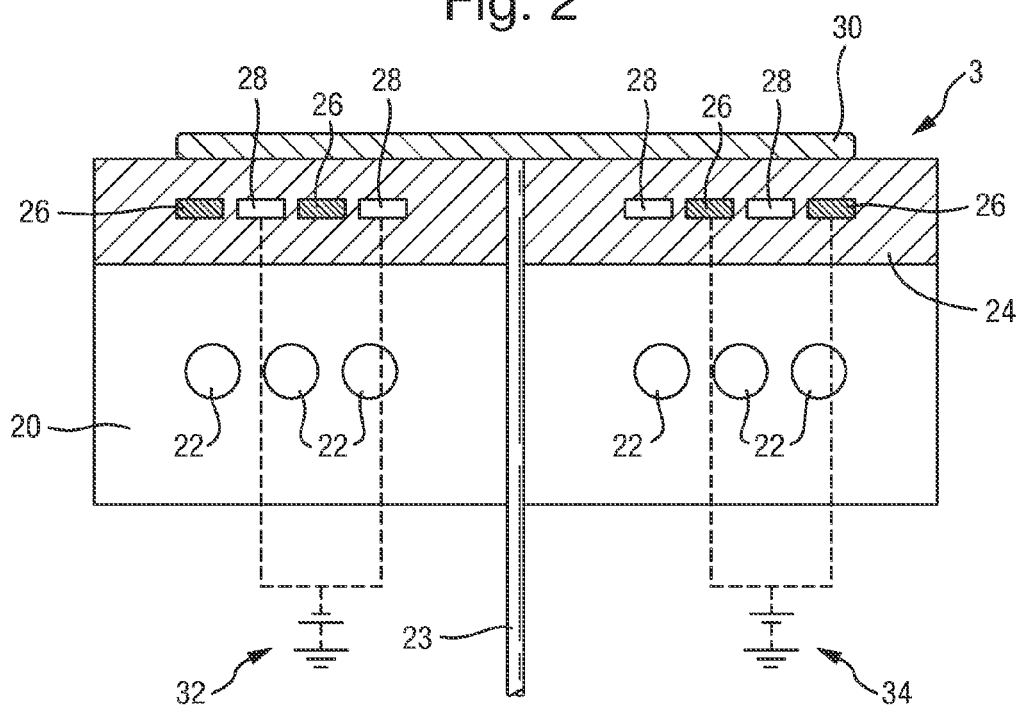
FIG. 2 illustrates the structure of the electrostatic clamping table in more detail.

FIG. 2 illustrates the ESC table 3 in more detail. This comprises a conventional RE driven table 20 with embedded cooling channels 22 and an upper dielectric, insulating layer 24. This layer is made typically from alumina, quartz, polyimide or similar materials. Two interdigitated sets of electrodes 26,28 are embedded in the layer 24. (Only some of the electrodes 26,28 are shown and labelled.)

A dielectric wafer 30 is shown on the insulating layer 24 having been placed on that layer using retractable lifting pins (not shown). The electrodes 26,28 are isolated from the wafer 30 by the insulating material of the layer 24 which also insulates the electrodes from the underlying base 20. The ESC electrodes 26,28 are connected to one or more power supplies 34,32 via electrical feed-throughs (shown by dashed lines), the power supplies being controlled in turn by the control system 10 (FIG. 1). There are two independently powered sets 26 and 28 of ESC electrodes, with adjacent conducting tracks normally at opposite potential or polarity. However, a single power supply in which either terminal can be positive or negative with respect to ground is an option.

Helium gas to maintain a wafer backside pressure is supplied into the region between the wafer 30 and layer 24 via a supply pipe 23 extending through the table 20 and layer 24.

Figure 3A:
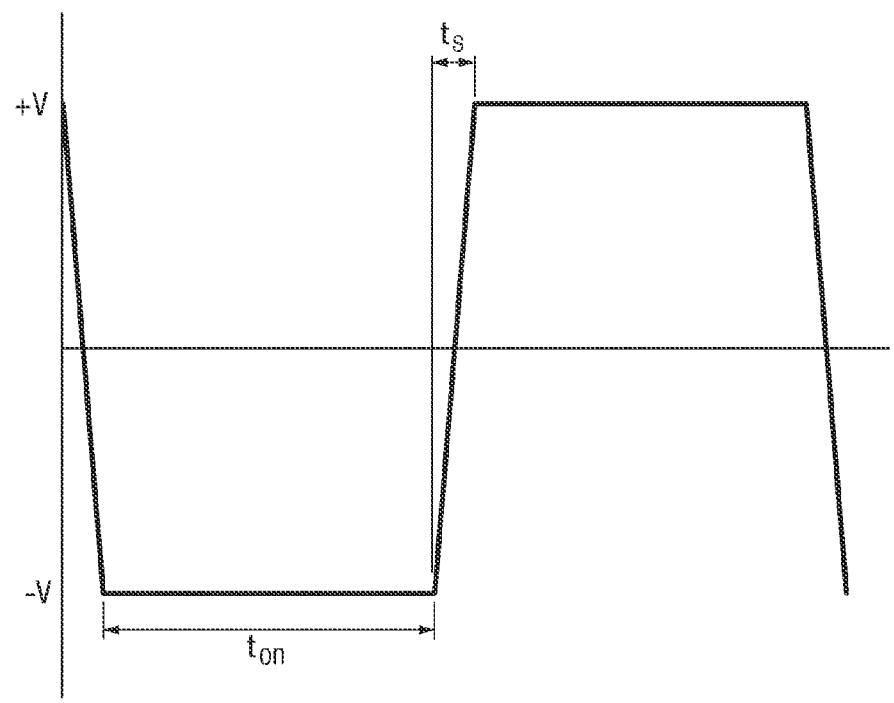
FIG. 3A illustrates a typical applied voltage waveform.

In use, a voltage is applied to one set of interconnected electrodes, e.g., 26, and the polarity of that voltage is reversed periodically (between +V and −V) as shown in FIG. 3A. At the same time, another voltage is applied to the other set of interconnected electrodes, e.g. 28. The voltage applied to each electrode 28 usually has the same magnitude but in opposite polarity with respect to each electrode 26. For ease of discussion, the time during which a steady state voltage is applied is labelled $t_{on}$ and the time during which the voltage is switched from one polarity to the other is labelled $t_s$.

A specific example of a pair of opposed voltage waveforms applied to respective sets of electrodes 26,28 are shown in FIGS. 3B and 3C. As can be seen, the voltage is varied exactly in phase but in opposite senses between +3000V and −3000V. The compensation for DC bias during the plasma on period is also depicted.

Figure 4:
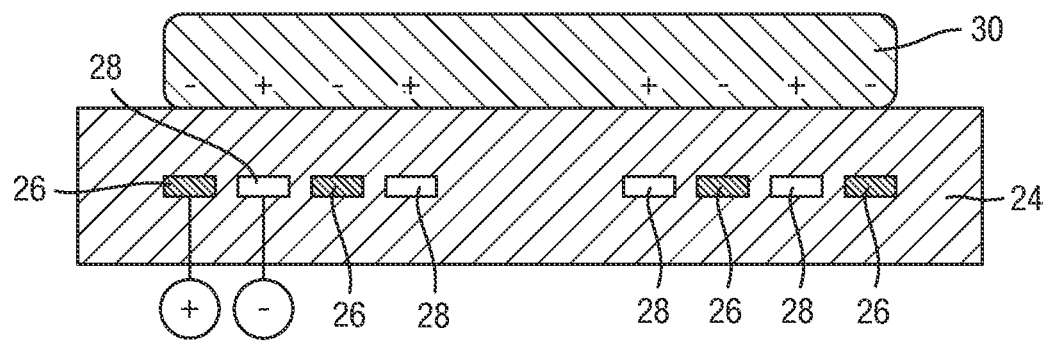
FIGS. 4-8 are schematic views of the ESC supporting a wafer and showing the location of typical clamping charges at different stages in the process.

When voltage is initially applied between adjacent electrodes 26,28 (FIG. 4), with electrodes 26 at a positive potential +V and electrodes 28 at a negative potential −V, polarisation charges appear at the lower surface of the wafer 30, positive surface charge near the negative ESC electrodes 28 and vice versa. This creates the clamping force. The time to establish this initial clamping is of order a few seconds, dominated by the nature of the substrate material.

Figure 5:
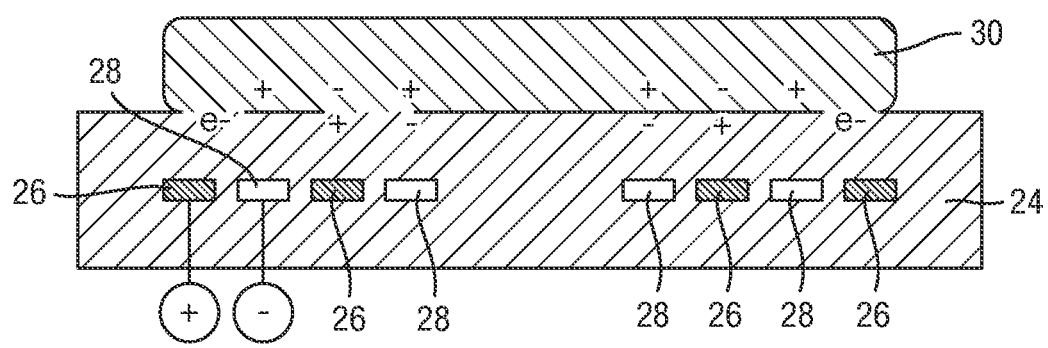

Over a time period typically in the range 10-100 seconds, charges begin to migrate from the plasma into the interface between the wafer 30 and the ESC 24 (FIG. 5). Positive ions will be drawn towards the more negative ESC electrodes 28, and electrons towards the more positive electrodes 26. It is expected that the penetrating charges are more likely to be electrons (e⁻), being more mobile, and the figures are drawn assuming electron penetration dominates. The arguments here apply to either polarity. These penetrating charges tend to screen the ESC electric field so that it no longer creates a polarisation charge in the wafer 30, and clamping will be lost if sufficient screening occurs.

Figure 6:
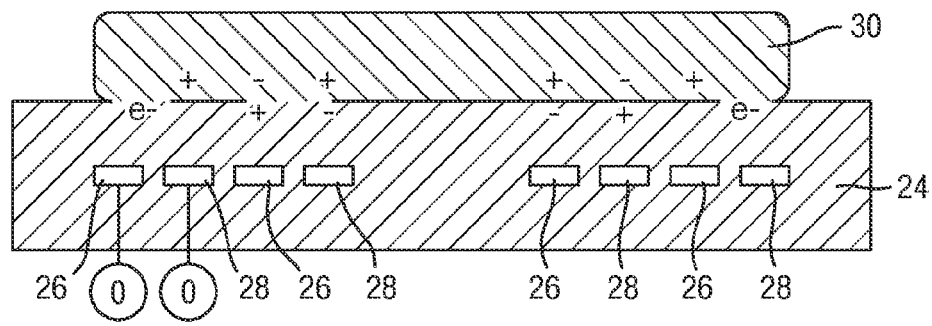

At the moment of voltage reversal ($t_s$ and shown in FIG. 6 at the moment when the voltage is zero), both the polarisation charge and the penetration edge charge retain their positions at least partially during switching. The edge region remains inactive for clamping, while the clamp force in the central region is substantially maintained by the wafer polarisation delaying the change of charge state of the embedded electrodes.

Figure 7:
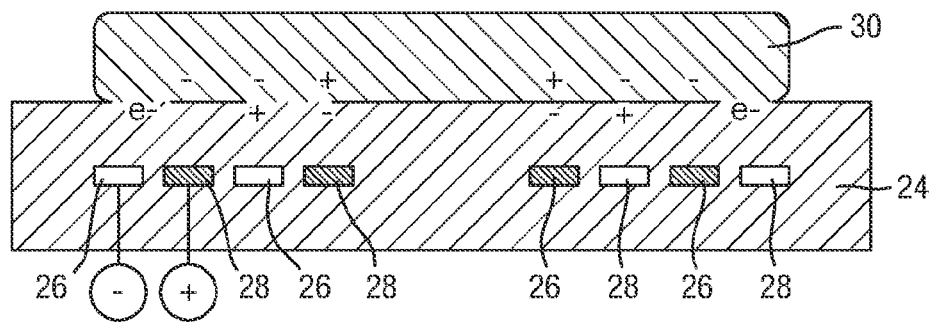

When the ESC polarity has reversed fully (FIG. 7), the roles of the edge and central region are reversed as regards to clamp forces. In the central region, any residual polarisation charge tends to reduce the effectiveness of the local ESC electrodes, and the clamp force there is diminished. At the edge, however, the penetration charge will tend to reinforce the ESC voltage, enhancing the formation of polarisation charge in the wafer and tending to accelerate clamping force being established there.

Figure 8:
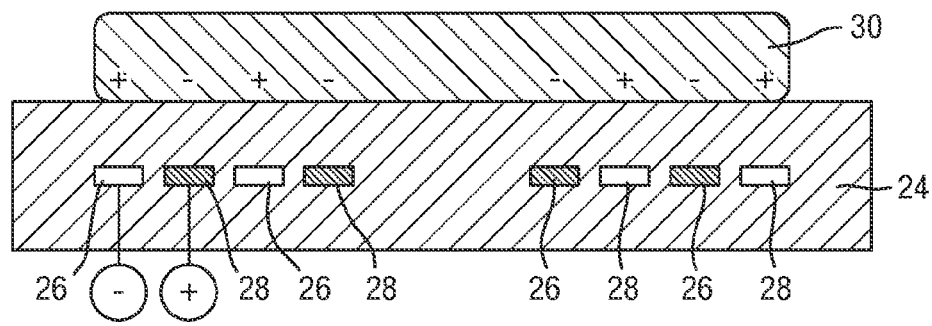

After further time (FIG. 8), the edge penetration charges will be driven out by the changed ESC polarity, and polarisation is reversed in the centre, establishing conditions similar to those after initial clamping, but with reversed polarity.

It is necessary to reverse the polarity before either the edge charge penetration or continuing bulk charge migration causes de-clamping, and after sufficient wafer polarisation has occurred to maintain sufficient clamp force when the ESC voltage is momentarily removed. A rise in the leakage of helium backside gas can be used to signal the need to switch polarity. The duration of polarity reversal must be short compared with the shorter of the edge charge or the wafer polarisation characteristic time constants.

Given the above discussion, it remains to determine the form of the voltage waveform. In practice, this will be determined utilizing a test wafer, the resultant values for $t_{on}$, and $t_s$ being stored by the control system which can than control the voltage source to generate the required waveform.

$t_s$ and $t_{on}$ are set following a determination of $T_1$, $T_2$, and $T_3$ defined above.

In order to determine $T_1$, in one preferred example the following steps are performed:
1. A wafer is clamped under a steady voltage in the absence of plasma, and a pressure, typically a backside pressure, is established in the range 5-15 Torr with a low helium leak flow (less than 2 sccm).
2. After a time interval, the clamp voltage is zeroed, and the helium leak flow is observed in the next minute.
3. The time interval is varied with repeated clamping events, until the minimum clamping voltage on time is established at which the helium flow increases by no more than 20% in two seconds after the clamp voltage is removed. This defines the time at which sufficient polarisation charges are present in the wafer to hold it during voltage switching. The period between voltage reversal events during clamping in use with a plasma is equal to or greater than this time period.

This is exemplified in FIG. 10 where a steady clamp voltage was applied for 5 seconds without a plasma and then the clamp voltage was zeroed. (Time=zero in FIG. 10.) Clamping was lost in two seconds.

To determine the time $T_2$, in one preferred example the following steps are carried out:
1. A wafer is clamped under a steady voltage and plasma is struck. The helium flow is observed until it rises sharply (indicating full loss of clamping) or the flow increases by more than 20% (indicating partial loss of clamping): the time is noted
2. The test is repeated with the polarity reversed. Again the time is noted. It may be different because different parts of the electrostatic chuck electrodes at the edge may have a polarity that tends to attract or repel the more mobile charge penetrating at the interface.

3. The switching time for use is chosen to be less than the lower of the two times.

This is exemplified in FIG. 9 which relates to Ar plasma (50 sccm Ar, 3 mTorr, 2000 W ICP, 100 W RIE). Helium pressure 10 Torr. Flow increased in this case by 25% in 200 seconds.

To determine T3, a steady clamping voltage was applied for an hour with a helium backside pressure of 10 Torr, in the absence of plasma. No significant change was observed in the helium flow rate, indicating that in this case T3 is greater than one hour, and that charge migration within the ESC did not limit the switching time in this case.

In this particular example, the time ($t_{on}$) between voltage switching should be less than $T_2$ which is less than 200 seconds (partial loss of clamping) and preferably less than 40 seconds (20% of this time), but greater than 5 seconds ($T_1$ time to establish polarisation charge). The edge charge migration time constant is shorter than the time constant (>1 hour) for loss of clamping by lateral charge migration in the bulk of the insulator in this case.

The time ($t_s$) to switch between one polarity and another should be less than 2 seconds (loss of wafer polarisation charge) and preferably less than 0.4 seconds (20% of this time). The edge charge migration has a longer time constant in this case, and does not limit the period for voltage reversal.

Figure 3D:
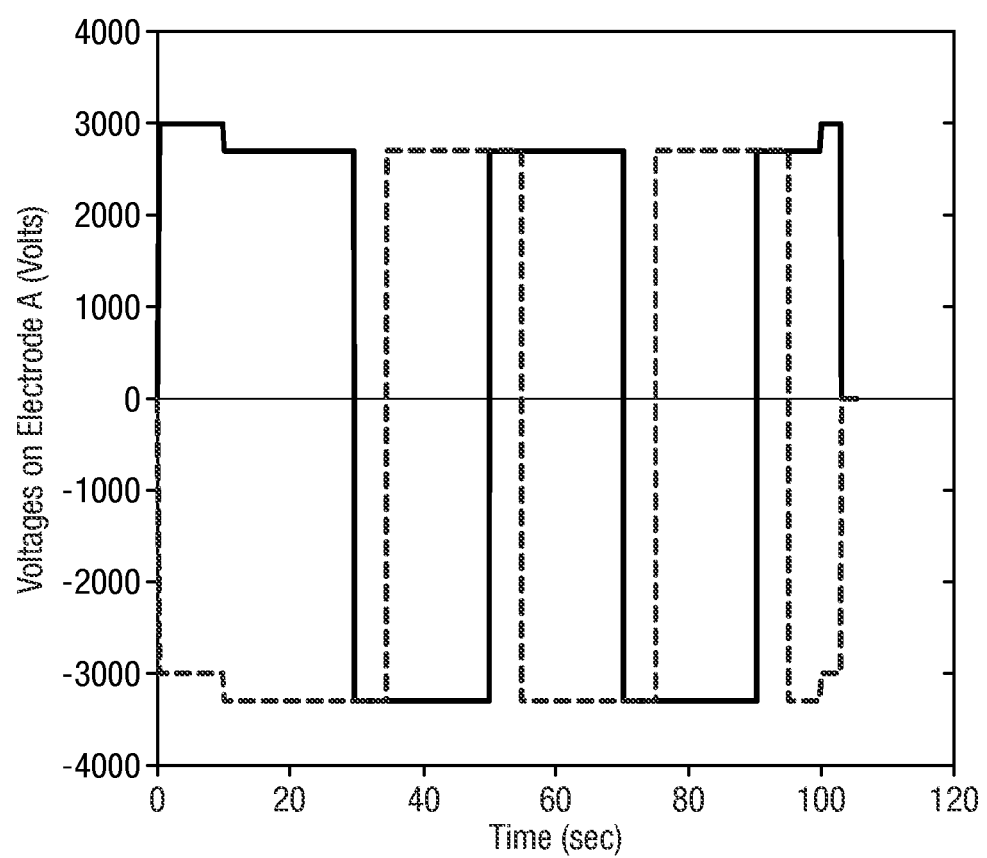
FIG. 3D illustrates a second example of a pair of voltage waveforms applied to respective sets of electrodes with an additional phase shift delaying the transition of one voltage with respect to the other.

We have found in some cases that using a pair of voltage waveforms that vary exactly together as shown in FIGS. 3B and 3C can lead to some problems if there is limited charge leakage at wafer edge. To mitigate this problem, we have developed the use of a modified pair of waveforms in which a phase shift is introduced between the two waveforms. An example of this is shown in FIG. 3D. The advantage of this is that when one channel is switching, the other is not, so a monopolar clamping force is present during the switching process. Phase shifts longer than the switching time are preferred. For example we have used a 3 second phase shift in a 20 second full cycle, where the switching time was less than 0.5 seconds.

It is possible to modify and in particular extend the time T2 by providing an edge ring around at least the table and preferably the wafer to shield the process table 20 from plasma damage. Two examples of these edge rings are shown in FIGS. 15 and 16 respectively. In FIG. 15, an edge ring 40 extends around the insulating layer 24 and a groove 41 in the table 20 and has an upper surface 42 flush with the upper surface 43 of the insulating layer 24. The edge ring 40 is fitted about the insulating layer 24 while the wafer 30 extends over a part of the edge ring 40.

In the example shown in FIG. 16, an edge ring 42 is provided which has an upper ring section 46 which protrudes above the level of the wafer 30 preferably by an amount in the range 0.5-3 mm. This form of edge ring can extend the time T2 up to four times compared to the version shown in FIG. 15. The edge ring reduces the ingress of charges at the wafer edge.

The extension in time must be balanced in practice with the uniformity of etching to the wafer edge, because excessive edge ring height suppresses the etch rate at the wafer edge.

The edge ring may be conductive or a dielectric.

Figure 11:
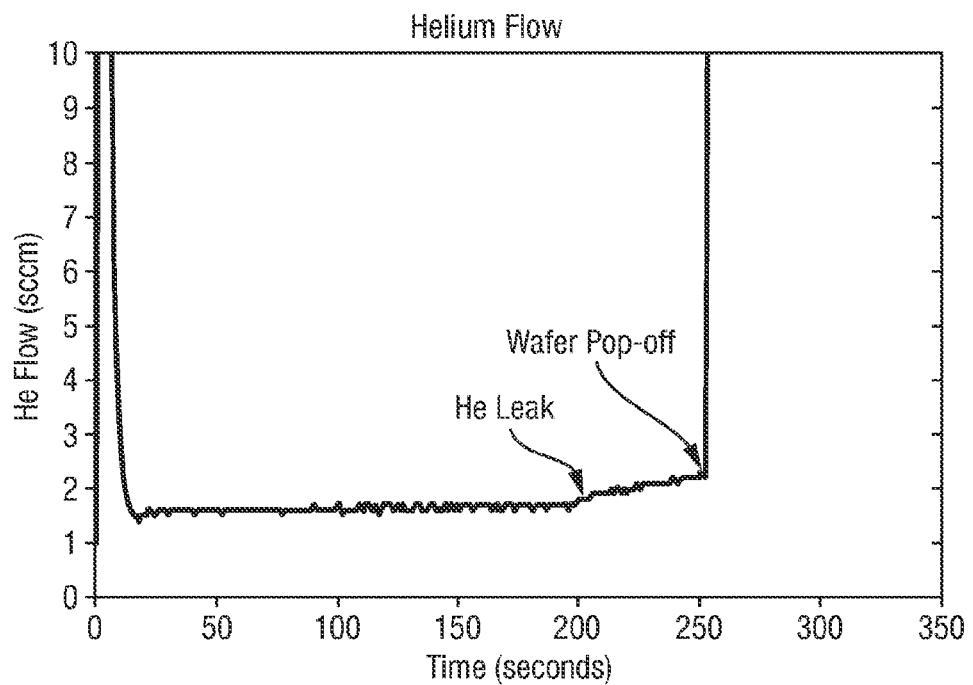
FIGS. 11-14 illustrate graphically a problem with the prior art and the variation of gas flow and temperature with time during clamping according to an example of the invention; and, FIGS. 15 and 16 are views similar to FIG. 2 and illustrate two examples of plasma processing apparatus including edge rings.

FIG. 11 is a graph showing the problem using existing prior art with 10 Torr He back pressure.

Initially, a high He flow is seen at the beginning of the process. This is due to filling of a volume underneath the process table for housing wafer lifting mechanism. It is not related to wafer clamping. After the initial He flow peak, a steady state is achieved during which clamping is satisfactory. After some time into the steady state, He flow rate starts to increase. This time is defined as He leak time in FIG. 11. The wafer will eventually pop off later on at around 250 secs.

Figure 12:
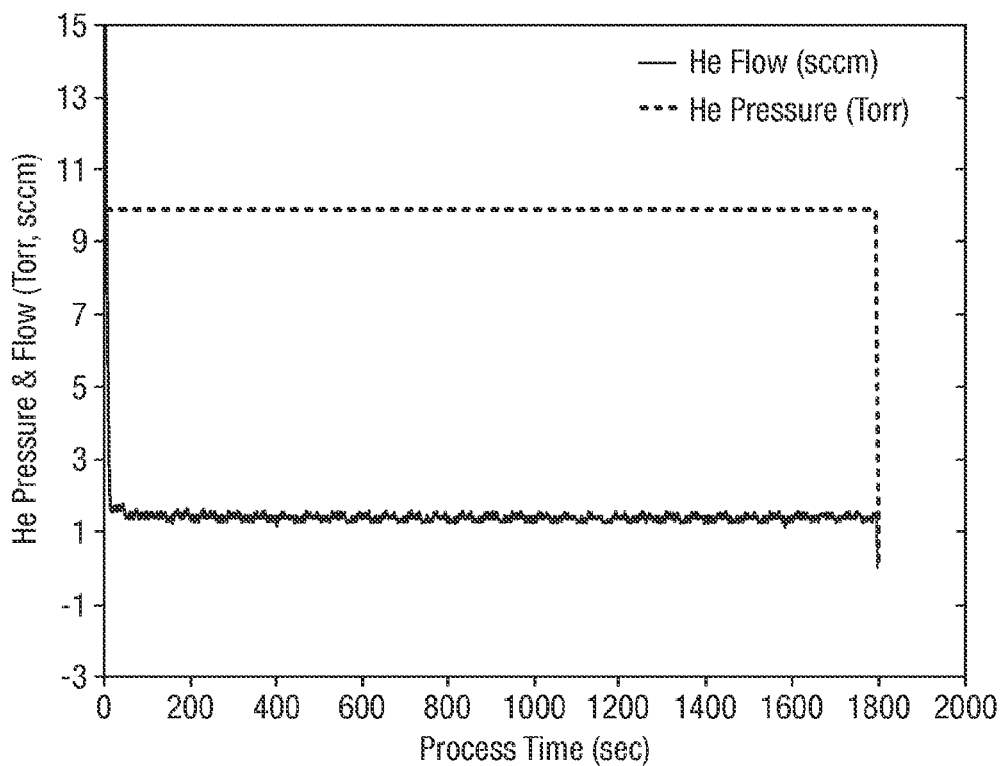

By utilising the inventive approach, clamping can be successful for holding a wafer for hours of operation. FIG. 12 is a graph showing He flow and pressure for a 30 minutes processing of a sapphire wafer with 10 Torr back side pressure.

Figure 13:
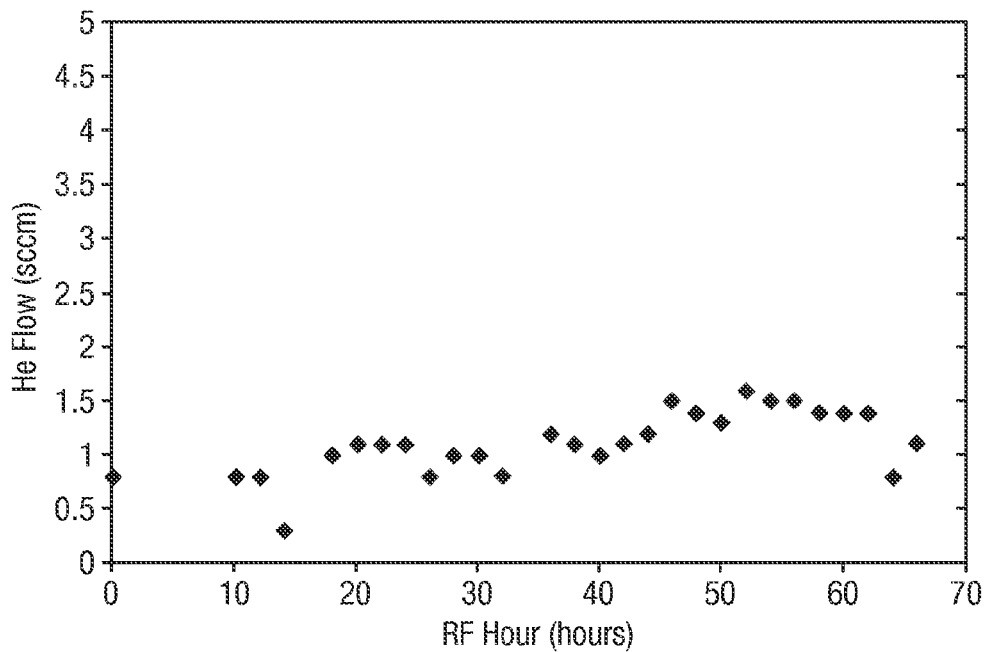

Reliability of clamping was also tested with a marathon run of 750 wafers for 60 RF hours. Average He flow per wafer is plotted in FIG. 13 with samples taken during the marathon.

It can be seen that He flow is maintained well below 2 sccm throughout the test.

Figure 14:
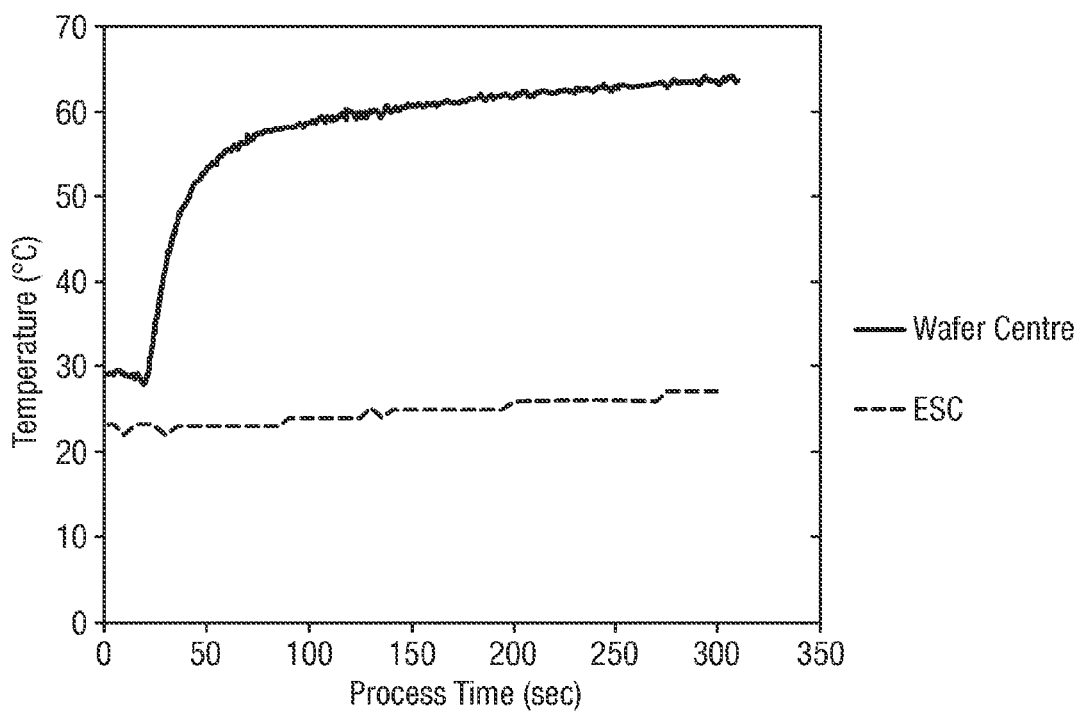

FIG. 14 is a data plot showing sapphire wafer temperature as a function of process time. It can be seen that the temperature difference between the wafer and the ESC is kept substantially constant after reaching steady state.

The invention claimed is:

1. A method of electrostatically clamping a dielectric wafer to a processing table during plasma processing, the table having interdigitated electrodes embedded therein, comprising applying respective voltages of opposite first and second polarities to adjacent electrodes wherein polarisation charges are induced in the wafer with opposite polarity to the respective underlying electrodes thereby electrostatically clamping the wafer to the table; and, after a predetermined time ($t_{on}$), reversing the polarities of the voltages so that the polarisation charges and electrostatic clamping continues characterized in that:
   i) the on time ($t_{on}$) of each of the first and second polarities is preselected to be
      a) greater than the time ($T_1$) required to generate sufficient polarisation charge in the wafer such that the wafer is held with a required pressure for at least 2 seconds after withdrawing of clamping voltages,
      b) less than the time ($T_2$) for the wafer to separate from the table by a first predetermined amount while in the presence of a steady voltage and a plasma, and
      c) less than the time ($T_3$) for the wafer to separate from the substrate by a second predetermined amount in the absence of a plasma, after an applied voltage has been applied; and in that
   ii) the time ($t_s$) for switching between the first and second polarities is less than the time ($T_1$) and less than 2 seconds.

2. A method according to claim 1, wherein the first and second predetermined amounts are substantially the same.

3. A method according to claim 1, wherein the times $T_2$ and $T_3$ are determined by experiment on a test wafer.

4. A method according to claim 1, wherein the first and second predetermined amounts are defined by injecting gas under constant pressure between the table and the wafer or test wafer, the first and second predetermined amounts corresponding to the condition when gas flow has increased by a respective predetermined amount or amounts.

5. A method according to claim 4, wherein the initial conditions with which the amount of gas flow is compared comprise a gas pressure in the range 5-15 Torr and a gas flow of less than 2 SCCM.

6. A method according to claim 4, wherein the gas comprises helium.

7. A method according to claim 1, wherein the time ($T_1$) is determined by the following steps:
   i. a wafer is clamped under a steady voltage in the absence of plasma, and a (backside) gas pressure is established, in the range 5-15 Torr with a low gas leak flow
   ii. after a time interval, the clamp voltage is zeroed, and the gas leak flow is observed in the next minute
   iii. the time interval is varied with repeated clamping events, until the minimum clamping voltage on time is established at which the gas flow increases by no more than 20% in two seconds after the clamp voltage is removed.

8. A method according to claim 1, wherein the time ($T_2$) is determined by:
   i) clamping the wafer or test wafer under a steady voltage, striking a plasma, and noting a first time for the wafer to separate from the substrate by the first predetermined amount;
   ii) repeating step i) but with reversed polarity voltage and noting a second time for the wafer to separate from the substrate by the first predetermined amount; and
   iii) selecting $T_2$ as the lower of the first and second times.

9. A method according to claim 1, wherein the time ($T_3$) is determined by the steps of applying a steady clamping voltage with a gas (backside) pressure in the absence of plasma, and monitoring gas flow until the wafer separates from the table.

10. A method according to claim 1, wherein the polarities of the voltages are reversed with a phase offset.

11. A method according to claim 1, wherein the base material of the wafer comprises sapphire, quartz, glass or silicon carbide.

12. A method according to claim 1, wherein the wafer comprises a non-insulating layer on an insulating base.

13. A method according to claim 1, further comprising providing an edge ring around the wafer.

14. A method according to claim 1, further comprising determining or estimating a DC offset voltage acquired by the wafer, and offsetting the voltages applied to the electrodes from ground by the offset voltage.

15. Plasma processing apparatus including a plasma generating chamber within which is provided a processing table having embedded interdigitated electrodes and on which a dielectric wafer is located in use; a voltage source coupled with the interdigitated electrodes; and a control system programmed to control the voltage source to apply respective voltages of opposite first and second polarities to adjacent electrodes wherein polarisation charges are induced in the wafer with opposite polarity respective to the underlying electrodes thereby electrostatically clamping the wafer to the table; and after a predetermined time ($t_{on}$) reversing the polarities of the voltages so that the polarisation charges and electrostatic clamping continues characterized in that:
   i) the on time ($t_{on}$) of each of the first and second polarities is preselected to be
      a) greater than the time ($T_1$) required to generate sufficient polarisation charge in the wafer such that the wafer is held with a required pressure for at least 2 seconds after withdrawing of clamping voltages,
      b) less than the time ($T_2$) for the wafer to separate from the table by a first predetermined amount while in the presence of a steady voltage and a plasma, and
      c) less than the time ($T_3$) for the wafer to separate from the substrate by a second predetermined amount in the absence of a plasma, after an applied voltage has been applied; and in that
   ii) the time ($t_s$) for switching between the first and second polarities is less than the time ($T_1$) and less than 2 seconds.

16. Apparatus according to claim 15 adapted to carry out a method of electrostatically clamping a dielectric wafer to a processing table during a plasma processing utilizing the programmed control system.

17. A method of generating and storing instructions on a record medium for use by the control system of plasma processing apparatus according to claim 15, the method comprising applying respective voltages of opposite first and second polarities to adjacent electrodes wherein polarisation charges are induced in the wafer with opposite polarity to the respective underlying electrodes thereby electrostatically clamping the wafer to the table; and after a predetermined time ($t_{on}$) reversing the polarities of the voltages so that the polarisation charges and electrostatic clamping continues characterized in that:
   i) the on time ($t_{on}$) of each of the first and second polarities is preselected to be
      a) greater than the time ($T_1$) required to generate sufficient polarisation charge in the wafer such that the wafer is held with a required pressure for at least 2 seconds after withdrawing of clamping voltages,
      b) less than the time ($T_2$) for the wafer to separate from the table by a first predetermined amount while in the presence of a steady voltage and a plasma, and
      c) less than the time ($T_3$) for the wafer to separate from the substrate by a second predetermined amount in the absence of a plasma, after an applied voltage has been applied; and in that
   ii) the time ($t_s$) for switching between the first and second polarities is less than the time ($T_1$) and less than 2 seconds.

18. A record medium storing instructions generated by a method according to claim 17.

19. A method according to claim 13, wherein the providing an edge ring around the wafer further comprises providing the edge ring above the wafer surface.

20. The method according to claim 4, wherein the condition is when the gas flow has increased by 20-25%.

21. The method according to claim 7, wherein the backside gas pressure is in the range 5-15 Torr with a low gas leak flow of less than 2 sccm.

22. The method according to claim 9, wherein the backside gas pressure is 10 Torr.

* * * * *